United States Patent [19]

Davis

[11] 4,178,584

[45] Dec. 11, 1979

[54] INTEGRATED INJECTION LOGIC DIGITAL-TO-ANALOG CONVERTER EMPLOYING FEEDBACK REGULATION AND METHOD

[75] Inventor: William F. Davis, Tempe, Ariz.

[73] Assignee: Motorola, Inc., Schaumburg, Ill.

[21] Appl. No.: 871,672

[22] Filed: Jan. 23, 1978

[51] Int. Cl.² .................................................. H03K 13/02
[52] U.S. Cl. ................................. 340/347 DA; 357/92; 307/213; 307/297; 323/1
[58] Field of Search .............. 340/347 DA; 307/213, 307/297, 303; 357/92, 46; 323/1

[56] References Cited

U.S. PATENT DOCUMENTS

| | | | |
|---|---|---|---|
| 3,916,218 | 10/1975 | Berger et al. | 357/92 |
| 3,978,473 | 8/1976 | Pastoriza | 307/297 |
| 4,029,974 | 6/1977 | Brokaw | 307/297 |
| 4,061,959 | 12/1977 | Ahmed | 323/1 |
| 4,075,508 | 2/1978 | Scott | 357/46 |

OTHER PUBLICATIONS

Electronics—Bipolar LSI Takes a New Direction With Integrated Injection Logic, by Hart, Slob and Wulms, Oct. 3, 1974, pp. 111-118.

Primary Examiner—Malcolm A. Morrison
Assistant Examiner—Gary Chin
Attorney, Agent, or Firm—Kenneth R. Stevens; Maurice J. Jones, Jr.; Marvin A. Glazer

[57] ABSTRACT

A digital-to-analog converter circuit suitable for implementation as an integrated circuit in integrated-injection-logic form, and a method for regulating the collector current in a plurality of integrated-injection-logic transistors are disclosed. A plurality of switching transistors are connected to digital input terminals and the currents conducted by the plurality of switching transistors are summed to yield an analog output current. An injection bar shared by each of the switching transistors provides drive current to the plurality of switching transistors. The injection bar is also shared by one or more reference transistors, the current in which is determined by a current source. A feedback circuit is used to regulate the bias of the common injection bar such that the current conducted by each switching device corresponds to the current conducted by each reference device.

13 Claims, 4 Drawing Figures

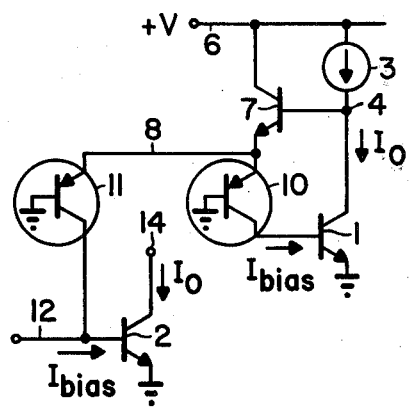
FIG. 1
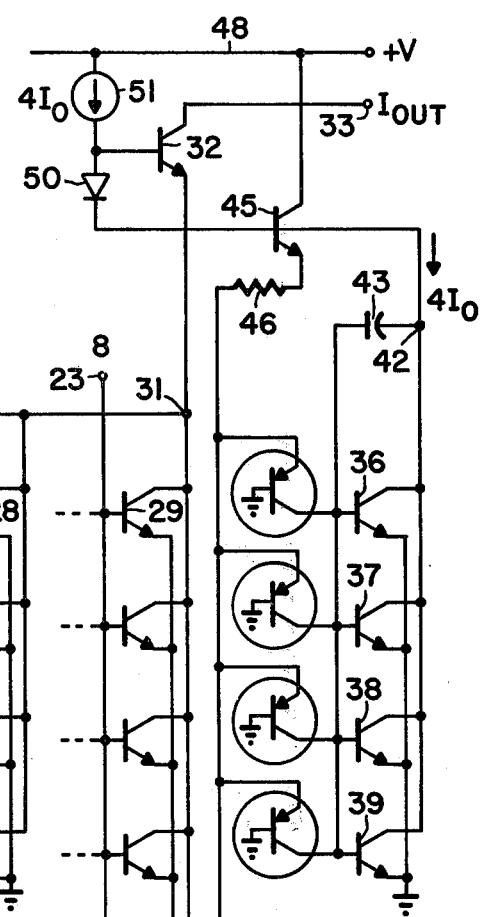
FIG. 2
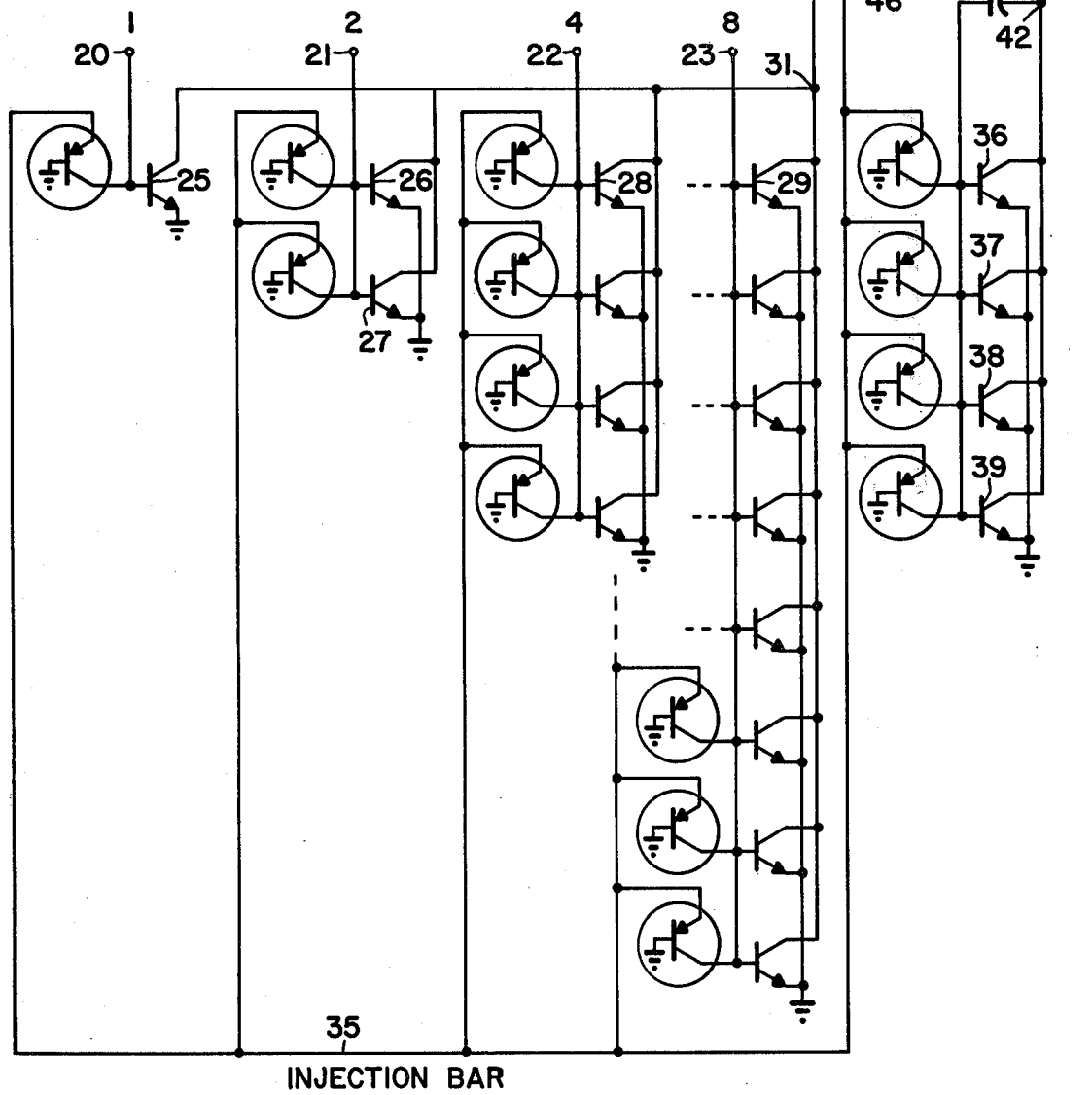
INJECTION BAR

INTEGRATED INJECTION LOGIC DIGITAL-TO-ANALOG CONVERTER EMPLOYING FEEDBACK REGULATION AND METHOD

BACKGROUND OF THE INVENTION

1. Field of the Invention

This invention relates generally to digital-to-analog converter circuitry and more particularly to a digital-to-analog converter in integrated-injection-logic form and method therefor.

2. Description of the Prior Art

Integrated circuits which perform digital-to-analog conversion are well known in the art. Integrated injection logic circuitry is also well known in the art and is widely used for increasing the density of circuitry fabricated within a monolithic integrated circuit. It is known by those skilled in the art that higher density of circuitry results in smaller chip dimensions, thereby yielding a greater number of integrated circuits formed from each processed wafer.

In prior art digital-to-analog converter circuits, it has been common to use a plurality of current sources which are switched by digital binary-weighted input signals for providing an analog current to the output; often resistors are used to determine the current that each current source contributes to the output current. However, resistors often require large amounts of chip area in the fabrication of the circuit. Also in the past, each current source transistor was fabricated in a separate epitaxial region which was isolated from every other current source transistor epitaxial region, which again caused the chip area necessary to fabricate the circuit to be increased. Thus, it will be obvious to those skilled in the art that a digital-to-analog converter circuit having current source transistors which need not be epitaxially isolated from one another and which does not require the use of resistors to fix the current conducted by the current sources will result in a more compact circuit and thereby lower the cost of manufacturing such a circuit.

In prior art I$^2$L (integrated-injection-logic) circuits, a current is supplied to the injection bar which supplies bias current to each I$^2$L transistor. However, the operating parameters for the I$^2$L transistors vary with temperature and with processing from circuit to circuit. Thus, the current conducted by the transistors varies also. For example, one operating parameter which varies with temperature and processing is beta ($\beta$) which equals the collector current of a transistor divided by its base or bias current. Thus, for a given bias current, the collector current varies with temperature and processing. As most I$^2$L circuits allow transistors to saturate when conductive, the variation in operating parameters is usually not critical. However, for those I$^2$L circuits in which transistors must generate a fixed collector current, as in a digital-to-analog converter, the variation in operating parameters causes undesired variation of the collector current.

SUMMARY OF THE INVENTION

An object of the present invention is to provide a digital-to-analog converter in integrated circuit form having improved component density and requiring less semiconductor chip area.

It is also an object of this invention to provide a digital-to-analog converter in integrated circuit form which employs integrated-injection-logic switching transistors.

It is also an object of this invention to provide, in a circuit employing a plurality of integrated-injection-logic transistors and an injection bar, a means for regulating the voltage applied to the injection bar so as to regulate the collector current in each of the plurality of transistors, and a method for doing the same.

Finally, it is an object of this invention to provide a means for biasing the injection bar of an integrated-injection-logic circuit such that the collector current in each I$^2$L transistor is maintained at a predetermined value regardless of changes in transistor operating parameters due to variations in temperature or substrate processing, and a method for doing the same.

Briefly described, one embodiment of the present invention relates to a circuit having one or more integrated-injection-logic current source transistors fabricated in a substrate, an injection bar also fabricated in the substrate, and a regulating circuit which adjusts the bias voltage applied to the injection bar such that the collector current in each current source transistor is constant regardless of variations in the operating parameters of the transistors. A second embodiment of the invention is a method for providing the bias voltage to the injection bar. A reference current source is used to supply a known current to the collectors of one or more reference transistors. A feedback loop responds to the voltage present at the collectors of the reference transistors and generates the bias voltage applied to the injection bar. The injection bar bias voltage rises until the bias current supplied to the base terminals of the reference transistors is sufficient to sustain the collector current supplied by the reference current source. The injection bar supplies identical amounts of bias current to the current source transistors, such that the collector current conducted by each of these transistors is identical to the collector current conducted by the reference transistors. In another embodiment, the injection bar is used to regulate the current conducted by a plurality of switching transistors, the current in which is summed to provide digital-to-analog conversion.

BRIEF DESCRIPTION OF THE DRAWINGS

FIG. 1 is a circuit drawing showing a simple feedback regulation loop for regulating the current conducted by a current source transistor.

FIG. 2 is a more detailed circuit schematic of a 4 bit digital-to-analog converter circuit according to a preferred embodiment of the invention.

DESCRIPTION OF THE PREFERRED EMBODIMENT

Figure 3:
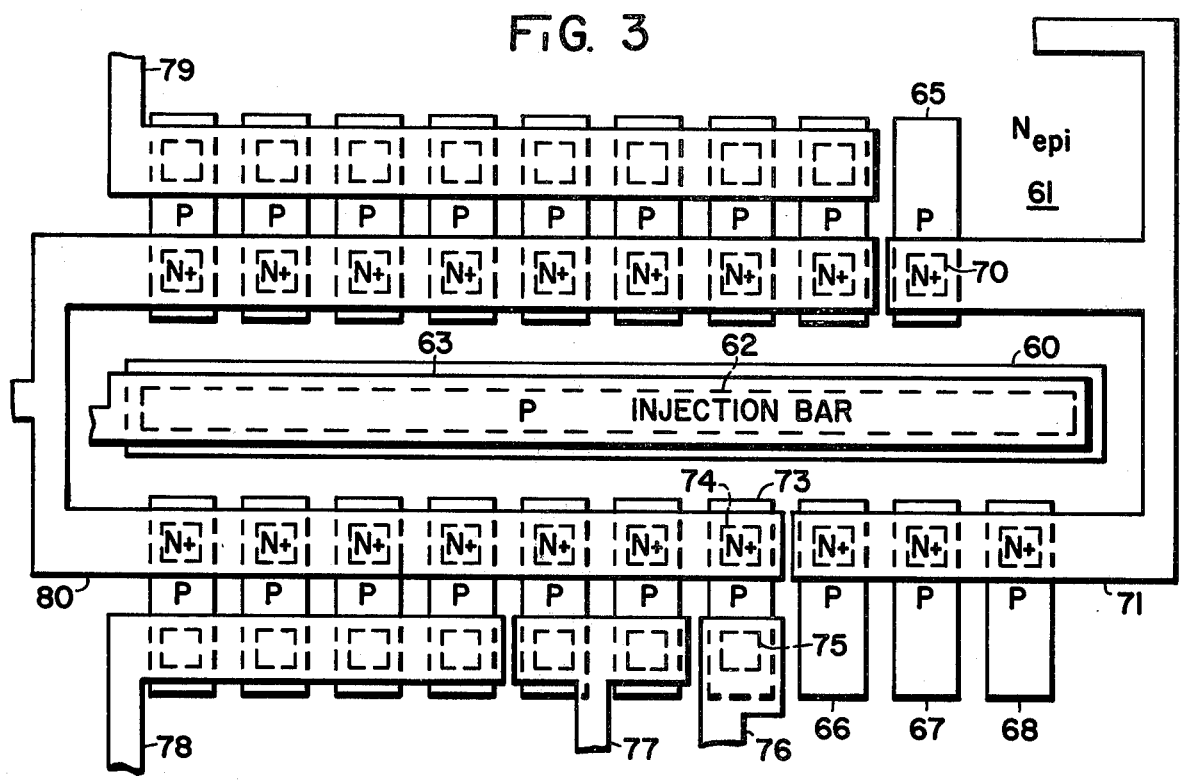
FIG. 3 is a layout drawing showing the placement of a plurality of switching and reference transistors in proximity to an injection bar on a monolithic integrated circuit substrate.

In FIG. 1 an integrated-injection-logic circuit is shown including a reference transistor 1 and a current source transistor 2 disposed in a substrate (not shown). Coupled to the collector of reference transistor 1 is a current source 3 which is shown coupled between conductor 6 and node 4. Current source 3 can be located outside the substrate, but preferably is fabricated within the substrate together with the other components. As current sources are well known in the art, current source 3 will not be further described. One example of such a current source is shown by Davis et al, "Integrated Circuit Current Regulator With Differential Amplifier Control", U.S. Pat. No. 3,735,240, assigned to the present assignee. Conductor 6 is shown connected to a positive supply potential (+V). Also coupled to node 4 is the base terminal of an emitter follower transistor 7 which has its collector coupled to conductor 6. The emitter terminal of emitter follower transistor 7 is coupled to an injection bar 8 which is disposed in proximity to reference transistor 1 and current source transistor 2.

In the vicinity of reference transistor 1, the injection bar 8 forms an injection transistor 10 (shown symbolically as a transistor enclosed by a circle) which supplies bias current to the base terminal of reference transistor 1. Similarly, in the vicinity of current source transistor 2, injection bar 8 forms a second injection transistor 11 which supplies bias current to the base terminal of transistor 2. The fabrication and function of injection transistors 10 and 11 is well known in the art and is described by Hart, Slob and Wulms in "Bipolar LSI takes a New Direction with Integrated Injection Logic", *Electronics* October 3, 1974, pps. 111 through 118. The base of current source transistor 2 is shown coupled to an input terminal 12, and the collector is coupled to an output terminal 14. Input terminal 12 may be used to render current source transistor 2 nonconductive, such that transistor 2 may operate as a switching transistor. The emitter terminals of reference transistor 1 and current source transistor 2 are coupled to a source of ground potential.

The operation of the circuit shown in FIG. 1 will now be described. Current source 3 supplies a current $I_O$ to the collector of reference transistor 1, it being assumed that the base terminal of emitter follower transistor 7 draws negligible base current from node 4. Th voltage on node 4 rises until it is roughly two forward diode voltage drops above ground potential, at which time emitter follower transistor 7 is made conductive and supplies current to injection bar 8. Injection transistor 10 is also made conductive, and current flows from injection bar 8 through injection transistor 10 to the base terminal of reference transistor 1. Thus, a feedback loop is created from the collector of reference transistor 1 through emitter follower transistor 7 and back to the base of reference transistor 1. The feedback loop is characterized by a negative gain which results in the voltage of injection bar 8 being stabilized at a voltage whereby the bias voltage across injection transistor 10 generates a bias current just sufficient to support the collector current $I_O$ in reference transistor 1. Thus, reference transistor 1, emitter follower transistor 7, and current source 3 comprise a biasing means for providing a regulated bias voltage to injection bar 8.

Since injection transistor 11 is identical to injection transistor 10, and because the bias voltage across injection transistor 11 is the same as that across injection transistor 10, the bias current conducted by injection transistor 11 is equal to that conducted by injection transistor 10. Therefore, with input terminal 12 left open, the bias current provided by injection transistor 11 produces a collector current in current source transistor 2 which is identical to the collector current conducted by reference transistor 1. Thus, output terminal 14 will sink a current of magnitude $I_O$ equal to that supplied by current source 3. If, however, input terminal 12 is grounded, then the bias current supplied by injection transistor 11 will flow out input terminal 12, bypassing the base terminal of current source transistor 2, and rendering transistor 2 nonconductive.

Still referring to FIG. 1, if the operating parameters of the transistors change, as will happen when the temperature increases for example, the bias voltage applied to the injection bar will be adjusted such that current source transistor 2 continues to conduct constant current $I_O$. An increase in temperature will cause current gain alpha ($\alpha$) of injection transistors 10 and 11 to increase, tending to increase the bias currents supplied to reference transistor 1 and current source transistor 2. An increase in temperature will also cause beta ($\beta$) for reference transistor 1 and current source transistor 2 to increase, tending to increase the collector currents in these transistors for given bias currents. However, if reference transistor 1 attempts to conduct a collector current greater than $I_O$, the collector voltage drops until the injection bar bias voltage is adjusted such that the bias current supplied to the base of reference transistor 1 is once more just enough to support collector current $I_O$. Because the operating parameters of injection transistor 11 track with those of transistor 10, and because the operating parameters of current source transistor 2 track with those of reference transistor 1, the readjustment of the injection bar bias voltage at the increased temperature maintains the collector current of current source transistor 2 at $I_O$.

In FIG. 2 a circuit is shown disposed in a substrate (not shown) according to a preferred embodiment of the invention to form a four-bit digital-to-analog converter circuit. Input terminals 20, 21, 22, and 23 receive a four-bit digital signal having a binary weighting of $2^0$, $2^1$, $2^2$, and $2^3$, respectively. Input terminal 20 is coupled to the base terminal of a single switching transistor 25. Input terminal 21 is coupled to the base terminals of switching transistors 26 and 27, each being identical to switching transistor 25. Similarly, input terminal 22 is coupled to the base terminals of four switching transistors, generally designated at 28, and input terminal 23 is coupled to the base terminals of eight switching transistors, generally designated at 29. The collectors of the plurality of switching transistors are commonly coupled to node 31 which is coupled to the emitter of output transistor 32. The collector of output transistor 32 is connected to output terminal 33 for the generation of the analog output signal.

Bias current for each of the plurality of switching transistors is provided by a corresponding plurality of injection transistors as indicated in FIG. 2 by a transistor enclosed by a circle. As has already been described with reference to FIG. 1, the injection transistors are formed between each of the switching transistors and an injection bar designated by conductor 35 which is in close proximity to the plurality of switching transistors.

Also in close proximity to injection bar 35 are reference transistors 36, 37, 38, and 39 which likewise receive bias current from a corresponding plurality of injection transistors, which again have been indicated by being enclosed by circles. The emitter terminals of each of the plurality of switching transistors and the emitter terminals of the reference transistors are all commonly coupled to ground potential. The collector terminals of reference transistors 36, 37, 38, and 39 are commonly coupled at node 42. A stabilizing capacitor 43 is also shown being coupled from node 42 to the base terminals of the reference transistors. Injection bar 35 is coupled to the emitter terminal of emitter follower transistor 45 through stabilizing resistor 46. The purpose of resistor 46 and capacitor 43 is to stabilize the feedback loop against high frequency oscillations by reducing the gain of the feedback circuit at high frequencies. Capacitor 43 can be fabricated within the substrate as a semiconductor p-n junction operated under reverse bias as is well known in the art. The base terminal of emitter follower transistor 45 is coupled to node 42 and the collector terminal is coupled to conductor 48 for coupling to a positive supply potential. The base terminal of emitter follower transistor 45 is also coupled to the cathode terminal of diode 50. The anode terminal of diode 50 is coupled to the base terminal of output transistor 32 and also to one terminal of current source 51, the other terminal of which is connected to conductor 48.

It will again be noted that a negative gain feedback loop has been created from the collectors of the reference transistors, through emitter follower transistor 45 and stabilizing resistor 46 to injection bar 35, and back to the base terminals of the reference transistors through the corresponding injection transistors. Current source 51 supplies a current of magnitude 4 $I_O$ to diode 50, it being assumed that the base current supplied to output transistor 32 is negligible. The current in diode 50 is conducted to the collectors of the four reference transistors, it again being assumed that the base current supplied to emitter follower transistor 45 is negligible. As the voltage on node 42 rises, emitter follower transistor 45 is made conductive and current is supplied from its emitter terminal to injection bar 35 through resistor 46. The voltage on injection bar 35 rises until a bias voltage across each of the injection transistors is sufficient to supply a bias current to each of the reference transistors such that each reference transistor conducts a collector current $I_O$.

Because the same injection bar that supplies bias current to the reference transistors also supplies bias current to the switching transistors, the resulting bias voltage on injection bar 35 supplies a like bias voltage across each of the injection transistors associated with each of the plurality of switching transistors. Thus, the bias current supplied to each of the switching transistors is identical to the bias current supplied to each of the reference transistors. Therefore, assuming that the input terminals 20, 21 22, and 23 are left open, each of the plurality of switching transistors will conduct a current $I_O$ equal to the collector current conducted by each of the reference transistors. The collector currents conducted by each of the switching transistors are summed at node 31, and the summed current is provided at output terminal 33 by output transistor 32. Because output transistor 32 and diode 50 are commonly coupled, the voltage at the collectors of the switching transistors (node 31) will be equal to the voltage of the collectors of the reference transistors (node 42). Therefore, the switching transistors and the reference transistors will exhibit identical characteristics.

FIG. 3 shows a preferred layout arrangement of the plurality of switching transistors, reference transistors, and the common injection bar. P type semiconductor region 60 forms an injection bar which is diffused or implanted into N type epitaxial region 61. Dashed lines 62 indicate a region where a surface oxide layer has been etched away so that a conductive layer 63 can make an ohmic contact to P type region 60.

In close proximity to P type injection bar 60 are P type semiconductor regions 65, 66, 67, and 68 corresponding to the base regions of four reference transistors. Into each of these P type semiconductor regions has been diffused or implanted an N+ type semiconductor region shown by dashed line 70 for P type region 65. These N+ type semiconductor regions form the collector contacts for each of the reference transistors which are commonly connected by metal run 71 for connection to the feedback loop circuitry (not shown)1. It can now be seen that injection transistors are formed in the vicinity of each of the reference transistors. For example, with regard to he reference transistor formed by P type semiconductor region 65, an injection transistor is formed by P type injection bar region 60 (emitter), N type epitaxial region 61 (base), and P type semiconductor region 65 (collector). N type epitaxial region 61 is coupled to a source of ground potential (not shown).

Similarly, a plurality of P type semiconductor regions identical to those used to form the reference transistors have been provided to form the switching transistors. For example, N+ type semiconductor region 74, P type semiconductor region 73, and N type epitaxial region 61 form one of the plurality of switching transistors. Dashed line 75 indicates an area where surface oxide has been etched away allowing metal run 76 to make an ohmic contact to base region 73. Similarly, metal run 77 contacts two like switching transistors, metal run 78 contacts four like switching transistors, and metal run 79 contacts eight like switching transistors. Metal runs 76, 77, 78, and 79 are coupled to input terminals (not shown) for receiving the four-bit digital signal. Metal run 80 contacts the collector regions of each of the plurality of switching transistors, thereby summing the collector currents conducted by each of the switching transistors for coupling to the output transistor (not shown). The geometries of the switching and reference transistors are identical and are equidistant from injection bar region 60. Thus, the switching and reference transistors have identical electrical characteristics. Moreover, the injection transistor formed in the vicinity of each switching or reference transistor has identical electrical characteristics to the injection transistors formed in the vicinity of each of the other transistors.

Figure 4:
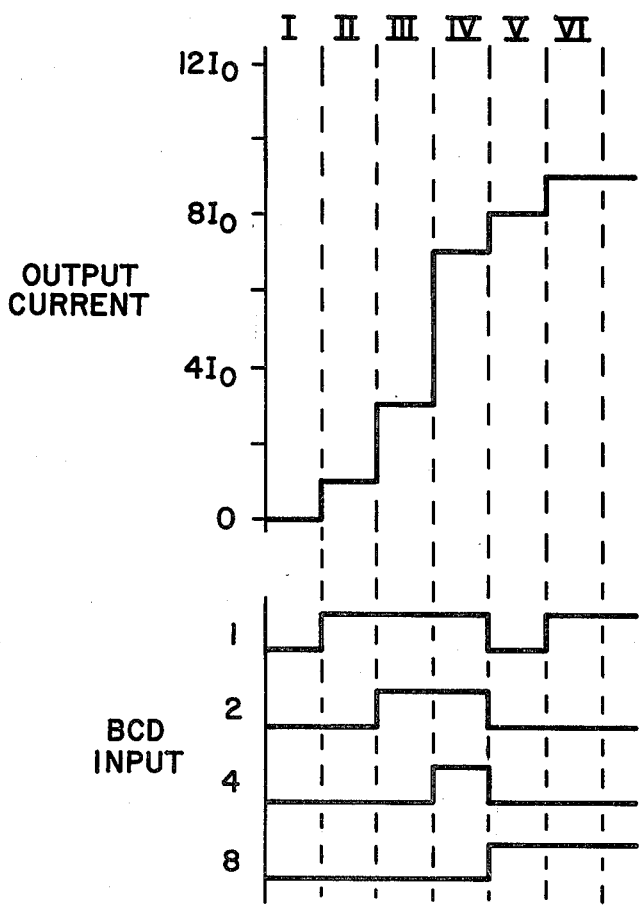
FIG. 4 is graph of various combinations of logic input signals applied to the circuit shown in FIG. 2 and the output signal which results from each of these input combinations.

In FIG. 4 a graph is shown relating the digital signal, applied to the input terminals of the digital-to-analog converter circuit shown in FIG. 2, to the output current generated at output terminal 33. During time interval I, all four input terminals are grounded. Thus, all of the switching transistors shown in FIG. 2 are nonconductive, and the output current is zero. During time interval II, the input terminal of the least significant bit is disconnected from ground potential, allowing switching transistor 25 to be conductive. The remainder of the switching transistors are held nonconductive, and an output current $I_O$ is produced at output terminal 33. During time interval III, input terminal 21 is also disconnected from ground allowing switching transistors 26 and 27 to also conduct. Each of the switching transistors 25, 26, and 27 conducts a collector current $I_O$ thereby generating a total output current of 3 $I_O$ as shown in FIG. 4.

Thus, a digital-to-analog converter circuit has been disclosed which uses integrated-injection-logic transistors and a feedback circuit for controlling the bias of an injection bar for regulating the collector currents of a plurality of switching transistors. A method for regulating the collector currents in a plurality of transistors by providing a regulated bias voltage has also been disclosed.

What is claimed is:

1. An integrated circuit including a substrate for regulating the collector current in a plurality of integrated-injection-logic transistors comprising:
    (a) a plurality of I$^2$L transistors disposed in the substrate each having at least a collector terminal and characterized by operating parameters subject to variations,
    (b) injection bar means disposed in the substrate and in proximity to said plurality of I$^2$L transistors, said injection bar means forming a corresponding plurality of lateral injection transistors in conjunction with said plurality of I$^2$L transistors, said plurality of lateral injection transistors being for supplying bias current to said plurality of I$^2$L transistors, and
    (c) biasing means disposed in the substrate and coupled to said injection bar means and to the collector terminal of at least one of said plurality of I$^2$L transistors for supplying a constant current to the collector terminal of said at least one I$^2$L transistor and for providing a bias voltage to said injection bar means such that a constant collector current is maintained in each of said plurality of transistors regardless of variations in said operating parameters.

2. An integrated circuit as recited in claim 1 wherein said variations in operating parameters result from variations in temperature.

3. An integrated circuit as recited in claim 1 wherein said variations in operating parameters result from variations in processing of said integrated circuit.

4. An integrated circuit including a substrate employing feedback to regulate collector current in an integrated-injection-logic transistor comprising:
    (a) a first and second transistor disposed in the substrate each having at least a collector terminal,
    (b) injection bar means disposed in the substrate and in proximity to said first and second transistors, said injection bar means forming lateral injection transistors in conjunction with said first and second transistors for supplying bias current to said first and second transistor, and
    (c) feedback means disposed in the substrate and coupled between the collector terminal of said first transistor and said injection bar means for supplying a constant collector current to said first transistor and for providing a biasing voltage to said injection bar means for maintaining a substantially constant collector current in said second transistor.

5. A circuit disposed in a substrate for regulating the collector current in a plurality of transistors comprising:
    (a) a plurality of transistors disposed in the substrate and characterized by operating parameters subject to variations, each of said plurality of transistors having a collector terminal,
    (b) injection bar means disposed in the substrate in proximity to said plurality of transistors, said injection bar means forming a corresponding plurality of lateral injection transistors in conjunction with said plurality of transistors for supplying bias current to said plurality of transistors,
    (c) current source means for generating a reference current, and
    (d) means disposed in the substrate and coupled to said current source means for providing the reference current to the collector terminal of at least one of said plurality of transistors and for providing a biasing voltage to said injection bar means such that each of the collector currents in said plurality of transistors is maintained in a predetermined relationship to said reference current over variations in said operating parameters.

6. A method for regulating the collector current in a plurality of transistors disposed in a substrate, said transistors being characterized by operating parameters subject to variations, said method comprising:
    (a) supplying bias current to each of said plurality of transistors from an injection bar disposed in the substrate in proximity to each of said plurality of transistors, said injection bar being disposed so as to form a corresponding plurality of lateral injection transistors in conjunction with said plurality of transistors,
    (b) providing a reference current to a bias generating circuit for generating a bias voltage,
    (c) applying the bias voltage to the injection bar for regulating the bias current supplied to the plurality of transistors, and
    (d) regulating said bias voltage for compensating for variations in said operating parameters.

7. A method for regulating the collector current in a plurality of current source transistors disposed in a substrate, said substrate also including at least one reference transistor having a collector terminal and an injection bar disposed in proximity to the plurality of current source transistors and to the reference transistor, said injection bar forming a plurality of lateral injection transistors in conjunction with said plurality of current source transistors and with the reference transistor for supplying bias currents to the plurality of current source transistors and to the reference transistor, said method comprising:
    (a) providing a reference current to the reference transistor for generating a voltage at the collector terminal of the reference transistor,
    (b) sensing the voltage at the collector terminal of the reference transistor,
    (c) generating a bias voltage in response to the voltage sensed at the collector terminal of the reference transistor,
    (d) biasing said injection bar with said biasing voltage, and
    (e) laterally injecting bias currents from said injection bar to said plurality of current source transistors and to said reference transistor such that said laterally injected bias currents are regulated by the bias voltage.

8. The method of claim 7 further comprising:
    (a) switching the plurality of current source transistors between conductive and nonconductive states in response to a series of binary-weighted digital input signals, and
    (b) summing the collector currents conducted by said plurality of current source transistors at a common output terminal for providing an analog indication of said binary-weighted digital input signals.

9. An integrated circuit including a substrate employing feedback to regulate collector current in an integrated-injection-logic (I$^2$L) switching transistor, comprising:

(a) a switching transistor disposed in the substrate having an input terminal for switching said switching transistor between conductive and nonconductive states, (b) a reference transistor disposed in the substrate having at least a collector terminal, (c) injection bar means disposed in the substrate in proximity to said switching transistor and to said reference transistor, said injection bar means forming first and second lateral injection transistors in conjunction with said switching transistor and with said reference transistor, respectively, for supplying bias current to said switching transistor and to said reference transistor, and (d) feedback means disposed in the substrate and coupled between the collector terminal of said reference transistor and said injection bar means for supplying a substantially constant current to said reference transistor and for providing a biasing voltage to said injection bar means such that the collector current in said switching transistor is substantially constant when said switching transistor is in the conductive state.

10. An integrated circuit employing feedback as recited in claim 9, wherein said feedback means comprises:

(a) an emitter follower transistor having at least emitter and base terminals for providing a biasing voltage to said injection bar means, the emitter terminal being coupled to said injection bar means, and the base terminal being coupled to the collector terminal of said reference transistor, and (b) a current source coupled to the collector terminal of said reference transistor for providing said substantially constant current to said reference transistor.

11. An integrated circuit disposed in a semiconductor substrate employing feedback to regulate collector current in an integrated-injection-logic ($I^2L$) curent-source transistor, comprising:

(a) a current-source transistor having emitter, base, and collector semiconductor regions, (b) a reference transistor having emitter, base, and collector semiconductor regions, (c) first and second injection transistors each having emitter, base, and collector regions, the base regions of said first and second injection transistors and the emitter regions of said current source transistor and said reference transistor all being in common and of a first conductivity type, the collector region of said first injection transistor being in common with the base region of said current source transistor and of a second conductivity type, the collector region of said second injection transistor being in common with the base region of said reference transistor and of said second conductivvity type, and the emitter regions of said first and second injection transistors being in common with each other and of said second conductivity type, said first and second injection transistors supplying bias current to said current-source transistor and to said reference transistor, respectively, and (d) feedback means coupled between the collector region of said reference transistor and the emitter regions of said first and second injection transistors for supplying a substantially constant current to the collector of said reference transistor and for providing a biasing voltage to said injection transistors.

12. An integrated circuit disposed in a substrate providing digital-to-analog conversion and employing feedback to regulate collector currents of a plurality of integrated injection logic ($I^2L$) switching transistors comprising:

(a) digital input means for receiving a digital signal, (b) a plurality of switching transistors characterized by operating parameters, said plurality of switching transistors being disposed in the substrate, coupled to said digital input means, and responsive to said digital signal for switching said plurality of switching transistors between conductive and nonconductive states, (c) at least one reference transistor disposed in the substrate and having at least a collector terminal, (d) injection bar means disposed in the substrate in proximity to said plurality of switching transistors and in proximity to said at least one reference transistor, said injection bar means forming a plurality of lateral injection transistors in conjunction with said plurality of switching transistors and with said at least one reference transistor for supplying bias current to said plurality of switching transistors and for supplying bias current to said at least one reference transistor, (e) biasing means disposed in the substrate and coupled to said injection bar means and to the collector terminal of said at least one reference transistor for supplying a constant current to the collector terminal of said at least one reference transistor and for providing a bias voltage to said injection bar means such that the collector current in each of said plurality of switching transistors is maintained substantially constant over variations in said operating parameters when each of said plurality of switching transistors is switched to said conductive state, and (f) summing means disposed in the substrate and coupled to said plurality of switching transistors for summing the currents conducted by said plurality of switching transistors and for providing an analog output signal.

13. An integrated circuit as recited in claim 12 wherein said biasing means comprises:

(a) a current source coupled to the collector terminal of said at least one reference transistor for providing current to said at least one reference transistor, and (b) an emitter follower transistor having at least emitter and base terminals for providing a biasing voltage to said injection bar means, the emitter terminal being coupled to said injection bar means, and the base terminal being coupled to the collector terminal of said at least one reference transistor.

* * * * *